United States Patent
Tomizawa et al.

(10) Patent No.: US 10,707,378 B2
(45) Date of Patent: *Jul. 7, 2020

(54) SEMICONDUCTOR LIGHT-EMITTING DEVICE

(71) Applicant: ALPAD Corporation, Chiyoda-ku (JP)

(72) Inventors: Hideyuki Tomizawa, Kanazawa (JP); Akihiro Kojima, Nonoichi (JP); Miyoko Shimada, Hakusan (JP); Yosuke Akimoto, Nonichi (JP); Hideto Furuyama, Yokohama (JP); Yoshiaki Sugizaki, Fujisawa (JP)

(73) Assignee: ALPAD Corporation, Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/640,669

(22) Filed: Jul. 3, 2017

(65) Prior Publication Data
US 2017/0301829 A1 Oct. 19, 2017

Related U.S. Application Data

(62) Division of application No. 14/830,039, filed on Aug. 19, 2015, now Pat. No. 9,722,143.

(30) Foreign Application Priority Data

Mar. 12, 2015 (JP) .................. 2015-049093

(51) Int. Cl.
*H01L 33/38* (2010.01)
*H01L 33/44* (2010.01)
(Continued)

(52) U.S. Cl.
CPC .......... *H01L 33/382* (2013.01); *H01L 33/385* (2013.01); *H01L 33/40* (2013.01);
(Continued)

(58) Field of Classification Search
CPC ....... H01L 33/382; H01L 33/44; H01L 33/42; H01L 33/40; H01L 33/385; H01L 33/50; H01L 33/486
See application file for complete search history.

(56) References Cited

U.S. PATENT DOCUMENTS 8,110,421 B2 2/2012 Sugizaki et al.
8,460,671 B2 6/2013 Grandea, III et al.
(Continued)

FOREIGN PATENT DOCUMENTS

CN 102324458 A 1/2012
EP 2 390 933 A1 11/2011
(Continued)

OTHER PUBLICATIONS

Extended European Search Report dated Oct. 8, 2015 in Patent Application No. 15181553.7.
(Continued)

*Primary Examiner* — Su C Kim
(74) *Attorney, Agent, or Firm* — Oblon, McClelland, Maier & Neustadt, L.L.P.

(57) ABSTRACT

According to one embodiment, the p-side electrode is provided on the second semiconductor layer. The insulating film is provided on the p-side electrode. The n-side electrode includes a first portion, a second portion, and a third portion. The first portion is provided on a side face of the first semiconductor layer. The second portion is provided in the first n-side region. The third portion overlaps the p-side electrode via the insulating film and connects the first portion and the second portion to each other.

20 Claims, 13 Drawing Sheets

(51) Int. Cl.
*H01L 33/40* (2010.01)
*H01L 33/42* (2010.01)
*H01L 33/48* (2010.01)
*H01L 33/50* (2010.01)

(52) U.S. Cl.
CPC .............. *H01L 33/42* (2013.01); *H01L 33/44* (2013.01); *H01L 33/486* (2013.01); *H01L 33/50* (2013.01)

(56) References Cited

U.S. PATENT DOCUMENTS

| | | |
|---|---|---|
| 8,692,280 B2 | 4/2014 | Yeh |
| 2010/0078656 A1 | 4/2010 | Seo et al. |
| 2011/0260184 A1* | 10/2011 | Furuyama ............... H01L 33/38 257/98 |
| 2011/0266579 A1 | 11/2011 | Nagai |
| 2011/0284910 A1 | 11/2011 | Iduka et al. |
| 2012/0049219 A1* | 3/2012 | Kamiya ................ H01L 33/382 257/98 |
| 2012/0074441 A1* | 3/2012 | Seo ....................... H01L 27/153 257/91 |
| 2012/0097972 A1 | 4/2012 | Sugizaki et al. |
| 2013/0105827 A1 | 5/2013 | Kim et al. |
| 2013/0248904 A1 | 9/2013 | Sugizaki |
| 2013/0285090 A1 | 10/2013 | Furuyama |
| 2014/0014894 A1 | 1/2014 | Mohammed et al. |
| 2014/0117402 A1 | 5/2014 | Wang et al. |
| 2015/0263236 A1 | 9/2015 | Suzuki |

FOREIGN PATENT DOCUMENTS

| | | |
|---|---|---|
| EP | 2763196 | 8/2014 |
| JP | 11-150300 | 6/1999 |
| JP | 2013-201156 | 10/2013 |
| TW | 201507205 A | 2/2015 |
| WO | WO 2013/084155 A1 | 6/2013 |

OTHER PUBLICATIONS

Office Action dated Nov. 11, 2016 in Taiwanese Application No. 104125623 (w/English translation).

* cited by examiner

SEMICONDUCTOR LIGHT-EMITTING DEVICE

CROSS-REFERENCE TO RELATED APPLICATION

This application is a division of and claims the benefit of priority under 35 U.S.C. § 120 from U.S. application Ser. No. 14/830,039 filed Aug. 19, 2015, and claims the benefit of priority under 35 U.S.C. § 119 from Japanese Patent Application No. 2015-049093 filed Mar. 12, 2015; the entire contents of each of which are incorporated herein by reference.

FIELD

Embodiments described herein relate generally to a semiconductor light-emitting device.

BACKGROUND

Electrodes do not interfere with extraction of light from a light-emitting surface in a structure in which a p-side electrode and an n-side electrode are formed on one side of a semiconductor layer including a light-emitting layer. Such a structure offers a high degree of freedom in electrode profile and layout. Electrode profile and layout affect electrical characteristics and luminous efficiency, and require appropriate design.

DETAILED DESCRIPTION

Figure 1:
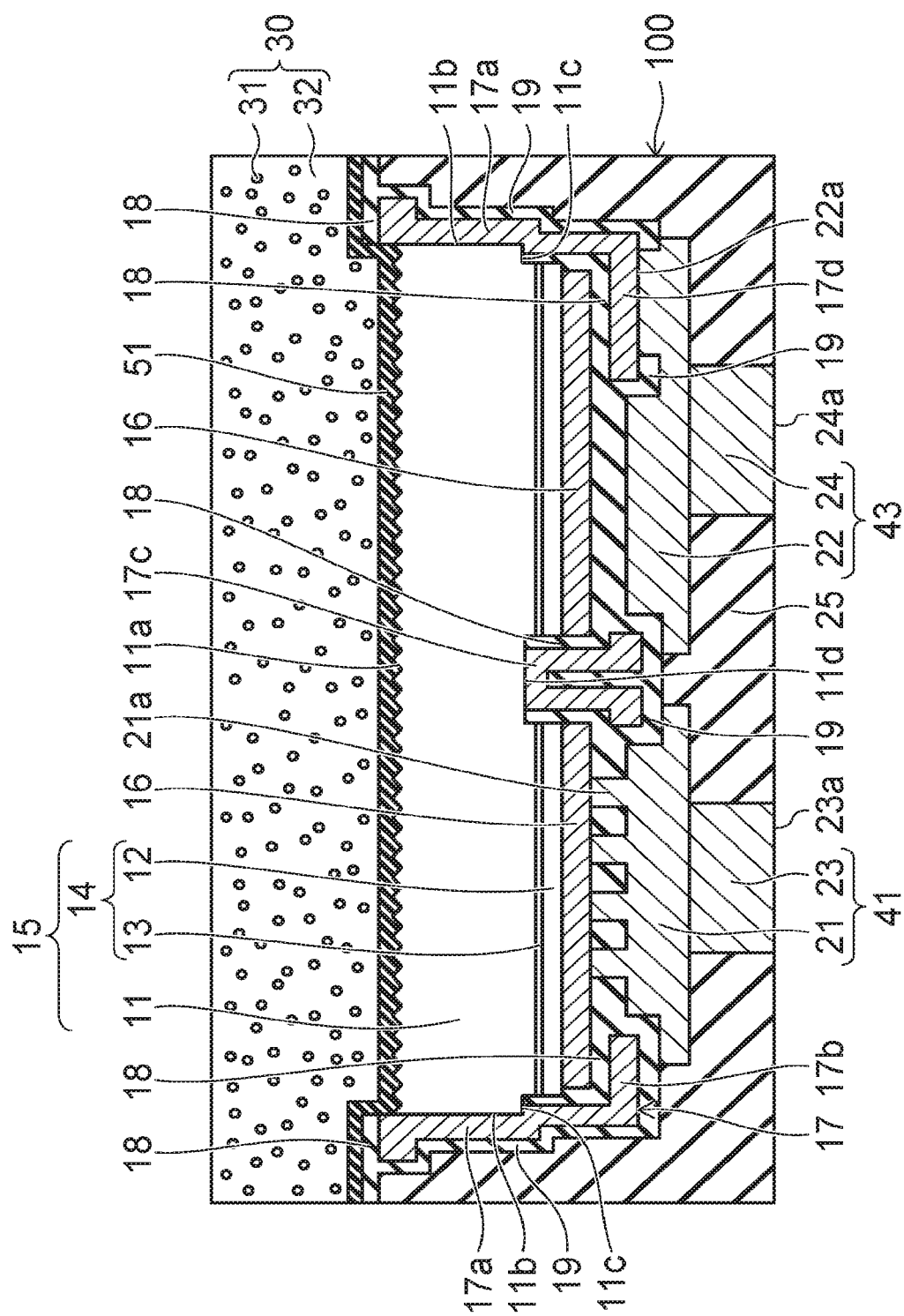
FIG. 1 is a schematic cross sectional view of a semiconductor light-emitting device of an embodiment.

According to one embodiment, a semiconductor light-emitting device includes a semiconductor layer, a p-side electrode, an insulating film, an n-side electrode, a p-side interconnection portion, and an n-side interconnection portion. The semiconductor layer includes a first semiconductor layer, a second semiconductor layer, and a light-emitting layer provided between the first semiconductor layer and the second semiconductor layer. The first semiconductor layer has a first n-side region surrounded by a stacked film including the light-emitting layer and the second semiconductor layer. The p-side electrode is provided on the second semiconductor layer. The insulating film is provided on the p-side electrode. The n-side electrode includes a first portion, a second portion, and a third portion. The first portion is provided on a side face of the first semiconductor layer. The second portion is provided in the first n-side region. The third portion overlaps the p-side electrode via the insulating film and connects the first portion and the second portion to each other. The p-side interconnection portion is provided on the insulating film and connected to the A-side electrode. The n-side interconnection portion is provided on the insulating film and connected to the n-side electrode.

Embodiments are described below with reference to the accompanying drawings. In the appended figures, the same components have the same reference numeral.

FIG. 1 is a schematic cross sectional view of a semiconductor light-emitting device of the embodiment.

Figure 2A:
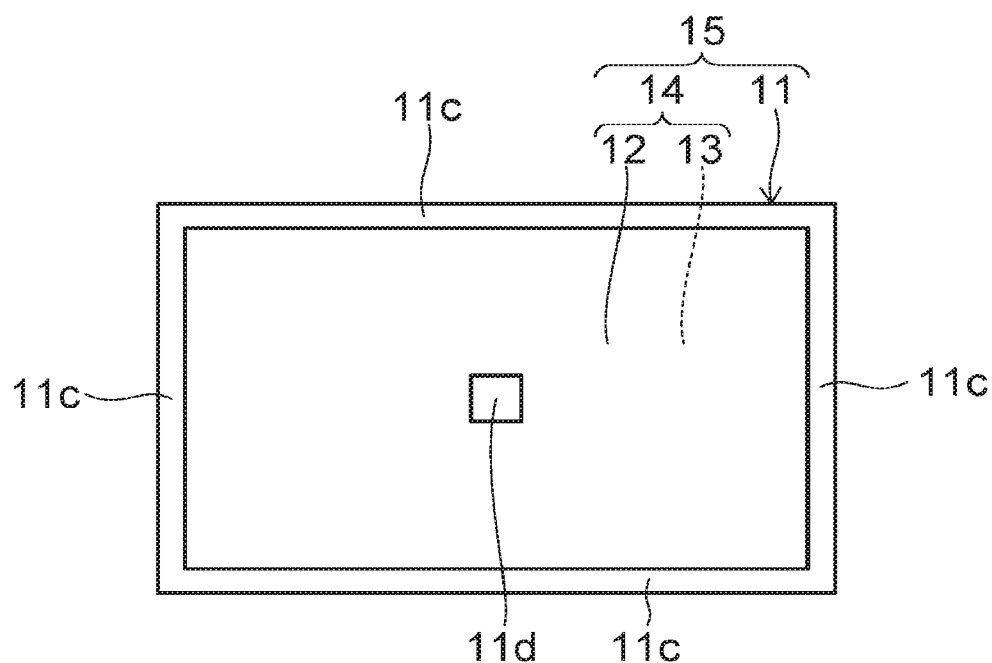
FIGS. 2A and 2B are schematic plan views of the semiconductor light-emitting device of the embodiment.

FIG. 2A is a schematic plan view showing an example of a planar layout of a first semiconductor layer 11 and a second semiconductor layer 12 shown in FIG. 1.

Figure 2B:
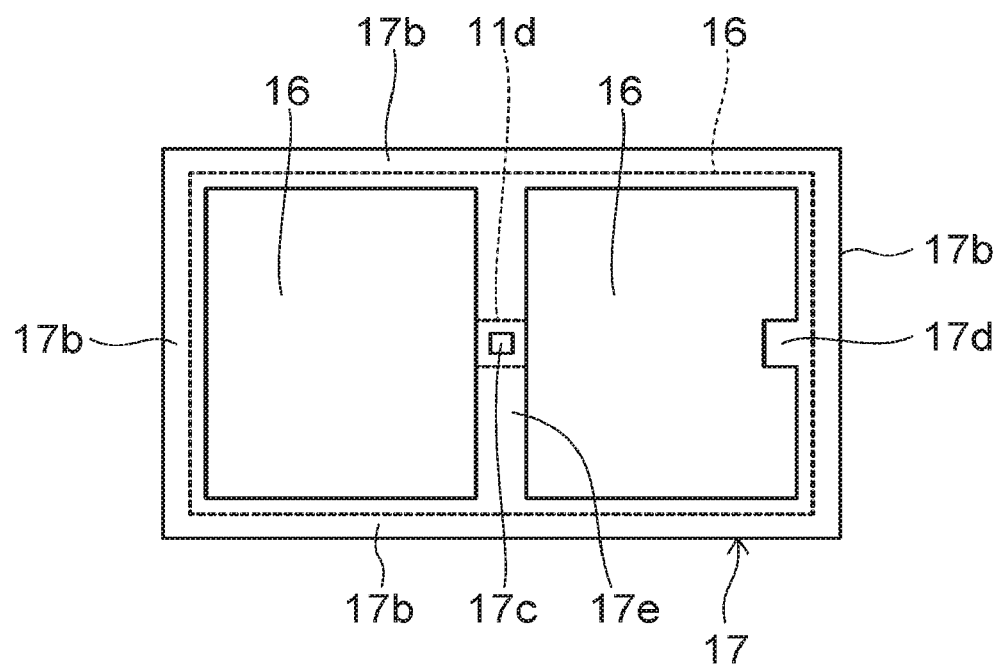

FIG. 2B is a schematic plan view showing an example of a planar layout of a p-side electrode 16 and an n-side electrode 17 shown in FIG. 1.

The semiconductor light-emitting device of the embodiment includes a supporting body 100, a fluorescent material layer 30, and a stacked body including a semiconductor layer 15 and provided between the supporting body 100 and the fluorescent material layer 30.

The semiconductor layer 15 includes the first semiconductor layer 11, the second semiconductor layer 12, and a light-emitting layer 13 provided between the first semiconductor layer 11 and the second semiconductor layer 12.

The first semiconductor layer 11 and the second semiconductor layer 12 contain, for example, gallium nitride (GaN). The first semiconductor layer 11 includes, for example, a foundation buffer layer, and an n-type GaN layer. The second semiconductor layer 12 includes, for example, a p-type GaN layer. The light-emitting layer 13 contains materials that emit light of different wavelengths, including blue, purple, bluish purple, and ultraviolet light. The emission peak wavelength of the light-emitting layer 13 occurs between, for example, 430 and 470 nm.

The first semiconductor layer 11 has a first face 11a, and a side face 11b that are continuous from the first face 11a. The first face 11a is roughened, and has a plurality of microirregularities.

A stacked film (mesa) 14 of the light-emitting layer 13 and the second semiconductor layer 12 is provided on the side of the first semiconductor layer 11 opposite the first face 11a. The stacked film (mesa) 14 is provided on the opposite side of the first face 11a.

The portion including the stacked film 14, a first n-side region 11d, and a second n-side region 11c are provided on the side of the first semiconductor layer 11 opposite the first face 11a. The stacked film 14 having the light-emitting layer 13 is not provided in the first n-side region 11d and the second n-side region 11c.

As shown in FIG. 2A, the first n-side region 11d is provided in, for example, an island-like (dot-like) pattern at a planar central portion of the semiconductor layer 15. The first n-side region 11d is continuously surrounded by the stacked film 14.

The second n-side region 11c is provided at the outer periphery side the first semiconductor layer 11, and, as shown in FIG. 1, is provided between the side face 11b of the first semiconductor layer 11 and the stacked film 14. As shown in FIG. 2A, the second n-side region 11c continuously surrounds the stacked film 14.

As shown in FIG. 1, the p-side electrode 16 is provided on the second semiconductor layer 12 of the stacked film 14. The p-side electrode 16 is not provided in the first n-side region 11d and the second n-side region 11c.

The n-side electrode 17 is provided on the side face 11b, and in the first n-side region 11d and the second n-side region 11c of the first semiconductor layer 11. The n-side electrode 17 has a first portion 17a, a second portion 17c, a third portion 17e, a fourth portion 17b, and a contact portion 17d. The first portion 17a, the second portion 17c, the third portion 17e, the fourth portion 17b, and the contact portion 17d are integrally formed with the same material. The first portion 17a, the second portion 17c, the third portion 17e, the fourth portion 17b, and the contact portion 17d are continuous with the same material.

The first portion 17a is provided on the side face 11b of the first semiconductor layer 11. The first portion 17a is provided on all of the side faces 11b of the first semiconductor layer 11, and continuously surrounds the side faces 11b. The first portion 17a is also provided in a part of the second n-side region 11c that is continuous from the side face 11b. The first portion 17a is in contact with the side face 11b and the second n-side region 11c. The first portion 17a projects out of the side face 11b on the opposite side from the first face 11a. The fourth portion 17b is integral with the first portion 17a at the leading end of the projection. As shown in FIG. 2B, the fourth portion 17b is provided along the outer periphery of the p-side electrode 16.

As shown in FIG. 1, the stacked film 14 and the p-side electrode 16 are covered with an insulating film 18. The insulating film 18 is, for example, an inorganic insulating film such as a silicon oxide film.

The fourth portion 17b overlaps the end portion of the p-side electrode 16 via the insulating film 18. The fourth portion 17b is, for example, an integral unit of four portions provided along the outer periphery of the p-side electrode 16.

The insulating film 18 is provided between the n-side electrode 17 and the stacked film 14, and between the n-side electrode 17 and the p-side electrode 16.

The second portion 17c of the n-side electrode 17 is provided in the first n-side region 11d of the first semiconductor layer 11. The second portion 17c is in contact with the first semiconductor layer 11 in the first n-side region 11d.

The first portion 17a and the second portion 17c are connected to each other via the fourth portion 17b and the third portion 17e (see FIG. 2B).

As shown in FIG. 2B, the third portion 17e connects two parallel portions in the four portions of the fourth portion 17b across the p-side electrode 16. The third portion 17e overlaps the p-side electrode 16 via the insulating film 18, and connects the first portion 17a and the second portion 17c to each other.

The contact portion 17d is provided on one of the four fourth portions 17b. The contact portion 17d projects out in a width direction of the fourth portion 17b. The contact portion 17d overlaps the p-side electrode 16 via the insulating film 18.

The n-side electrode 17 includes a first film (for example, an aluminum film) that makes ohmic contact with the first semiconductor layer (for example, an n-type GaN layer) 11. The aluminum film has reflectivity for light emitted by the light-emitting layer 13. The n-side electrode 17 also includes a second film (for example, a titanium film, a platinum film, a gold film, or a nickel film) stacked on the first film (aluminum film).

The p-side electrode 16 includes a first film (for example, a silver film) that makes ohmic contact with the second semiconductor layer (for example, a p-type GaN layer) 12. The silver film has reflectivity for light emitted by the light-emitting layer 13. The p-side electrode 16 also includes a second film (for example, a titanium film, a platinum film, a gold film, or a nickel film) stacked on the first film (silver film).

The light-emitting layer 13 emits light with the current supplied thereto through the p-side electrode 16 and the n-side electrode 17. The light from the light-emitting layer 13 enters into the fluorescent material layer 30 from the first face 11a side of the first semiconductor layer 11.

An area of the light-emitting region including the light-emitting layer 13 (the region where the p-side electrode 16 is provided) is larger than an area of the n-side region (the first n-side region 11d and the second n-side region 11c) not including the light-emitting layer 13. This makes it possible to provide a large light-emitting surface, and increase the light output.

The supporting body 100 is provided on the side of the semiconductor layer 15 opposite the first face 11a (second face side). The supporting body 100 supports the light-emitting element including the semiconductor layer 15, the p-side electrode 16, and the n-side electrode 17.

The fluorescent material layer 30 is provided on the first face 11a side of the semiconductor layer 15 as an optical layer that confers the desired optical characteristics to light emitted from the semiconductor layer 15. The fluorescent material layer 30 contains a plurality of particulate fluorescent materials 31. The fluorescent materials 31 are excited by light emitted from the light-emitting layer 13, and emit light of wavelength different from the wavelength of the light emitted from the light-emitting layer 13.

The fluorescent materials 31 are dispersed in a transparent layer 32. The transparent layer 32 transmits the light emitted from the light-emitting layer 13 and the light emitted from the fluorescent materials 31. The term "transparent" is not limited to 100% transmittance, and encompasses absorption of some of the light.

The p-side electrode 16 and the n-side electrode 17 are covered with the insulating films 18 and 19 on the side of the semiconductor layer 15 opposite the first face 11a (second face side). The insulating films 18 and 19 are, for example, inorganic insulating films such as a silicon oxide film.

A p-side interconnection layer 21 and an n-side interconnection layer 22 are separately provided on the insulating films 18 and 19.

Figure 7A:
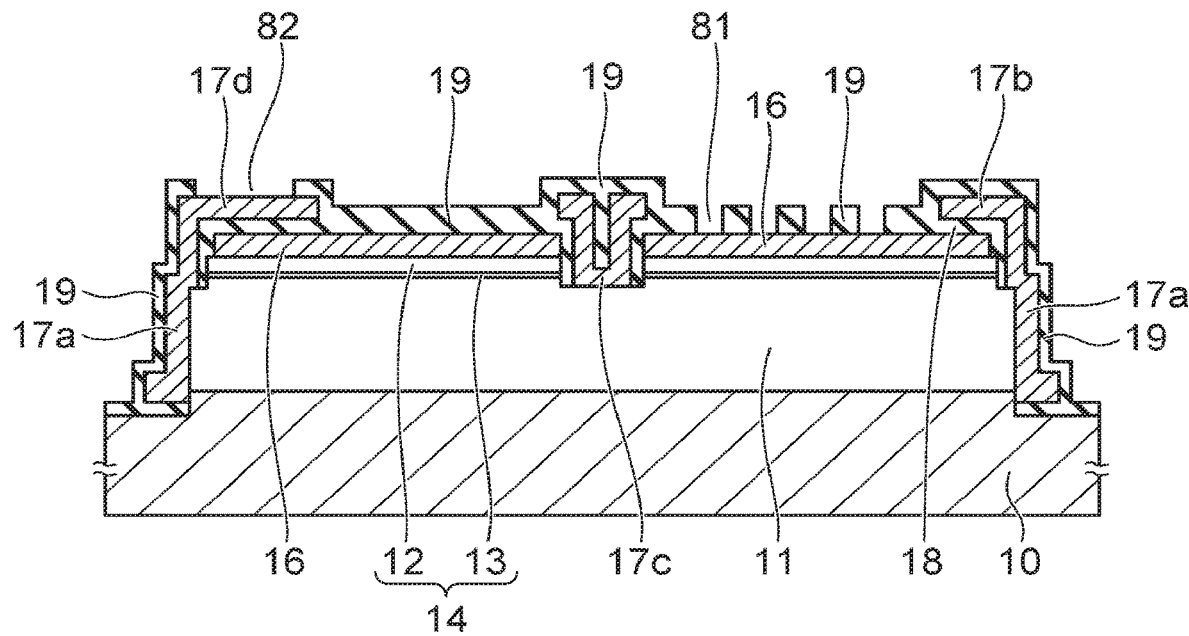

As shown in FIG. 7A, the insulating films 18 and 19 have a plurality of first openings 81 connecting to the p-side electrode 16, and a second opening 82 connecting to the contact portion 17d of the n-side electrode 17. The first openings 81 may be provided as a single larger opening.

The p-side interconnection layer 21 is provided inside the first openings 81, and on the insulating films 18 and 19. The p-side interconnection layer 21 is electrically connected to the p-side electrode 16 via a plurality of vias 21a inside the first openings 81.

The n-side interconnection layer 22 is provided inside the second opening 82, and on the insulating films 18 and 19. The n-side interconnection layer 22 is electrically connected to the contact portion 17d of the n-side electrode 17 via a via 22a inside the second opening 82.

The p-side interconnection layer 21 partially overlaps the third portion 17e of the n-side electrode 17 via the insulating film 19 on the side of the n-side interconnection layer 22. Other portion of the p-side interconnection layer 21 overlaps the fourth portion 17b of the n-side electrode 17 via the insulating film 19. The n-side interconnection layer 22 overlaps the p-side electrode 16 via the insulating films 18 and 19.

The p-side interconnection layer 21 and the n-side interconnection layer 22 include, for example, a copper film. The copper film is formed on a foundation metal film by, for example, plating. The foundation metal film includes a copper film that becomes a seed layer for plating, and, for example, an aluminum film having high reflectivity for light emitted from the light-emitting layer 13. The foundation metal film also includes a titanium film or a titanium nitride film provided between the copper film and the aluminum film. The titanium film or the titanium nitride film serves as a barrier film and an adhesive film.

The p-side interconnection layer 21 and the n-side interconnection layer 22 spread over the insulating films 18 and 19, occupying large portions of the region on the second face side of the semiconductor layer 15. The aluminum layer in the foundation of the p-side interconnection layer 21 and the n-side interconnection layer 22 is formed over large portions of the region on the second face side of the semiconductor layer 15. This enables an increase in the quantity of light directed to the fluorescent material layer 30.

The n-side electrode 17 having the aluminum film is also provided on the side face 11b of the first semiconductor layer 11. The light directed to the side face 11b of the first semiconductor layer 11 from the light-emitting layer 13 is reflected at the n-side electrode 17, and does not leak to outside. This enables prevention of color breakup or unevenness due to leakage of light from the side face of the semiconductor light-emitting device.

A p-side metal pillar 23 is provided on the p-side interconnection layer 21. A p-side interconnection portion 41 includes the p-side interconnection layer 21 and the p-side metal pillar 23. An n-side metal pillar 24 is provided on the n-side interconnection layer 22. An n-side interconnection portion 43 includes the n-side interconnection layer 22 and the n-side metal pillar 24.

A resin layer 25 is provided as an insulating layer between the p-side interconnection portion 41 and the n-side interconnection portion 43. The resin layer 25 is provided on the side face of the p-side interconnection portion 41 and on the side face of the n-side interconnection portion 43. The resin layer 25 is filled between the p-side metal pillar 23 and the n-side metal pillar 24, in contact with the side face of the p-side metal pillar 23 and the side face of the n-side metal pillar 24. The resin layer 25 is also filled between the p-side interconnection layer 21 and the n-side interconnection layer 22.

The resin layer 25 is also provided in a region (chip outer periphery portion) adjacent to the side face 11b of the first semiconductor layer 11, and covers the first portion 17a of the n-side electrode 17.

The end portion (face) of the p-side metal pillar 23 opposite the p-side interconnection layer 21 is exposed from the resin layer 25, and serves as a p-side external terminal 23a that is connectable to external circuits such as a mounting substrate. The end portion (face) of the n-side metal pillar 24 opposite the n-side interconnection layer 22 is exposed from the resin layer 25, and serves as an n-side external terminal 24a that is connectable to external circuits such as a mounting substrate. The p-side external terminal 23a and the n-side external terminal 24a are bonded to pads of a mounting substrate via, for example, a solder or a conductive bonding material.

The distance between the p-side external terminal 23a and the n-side external terminal 24a is longer than the distance between the p-side interconnection layer 21 and the n-side interconnection layer 22 on the insulating film 19. The p-side external terminal 23a and the n-side external terminal 24a are spaced apart from each other by a distance that is wider than the spread area of a solder used for mounting. This can prevent the solder from shorting the p-side external terminal 23a and the n-side external terminal 24a.

On the other hand, the p-side interconnection layer 21 and the n-side interconnection layer 22 can be brought as close to each other as the processing limit allows. This makes it possible to increase the area of the p-side interconnection layer 21, and thereby promote radiation of heat of the light-emitting layer 13.

The contact area of the p-side interconnection layer 21 and the p-side electrode 16 via the plurality of vias 21a is larger than the contact area of the n-side interconnection layer 22 and the n-side electrode 17 via the via 22a. In this way, a uniform current distribution can be ensured through the light-emitting layer 13.

The area of the n-side interconnection layer 22 spread on the insulating films 18 and 19 can be made larger than the areas of the first n-side region 11d and the second n-side region 11c. The area of the n-side external terminal 24a of the n-side metal pillar 24 provided on the n-side interconnection layer 22 can be made larger than the areas of the first n-side region 11d and the second n-side region 11c. In this way, the areas of the first n-side region 11d and the second n-side region 11c can be made smaller while providing a sufficiently large area for the n-side external terminal 24a to enable reliable mounting. The semiconductor layer 15 can have a smaller area in regions excluding the light-emitting layer 13, and the area of the light-emitting region having the light-emitting layer 13 can be increased to improve the light output.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The thickness of the p-side metal pillar 23 (the thickness from the p-side interconnection layer 21 to the p-side external terminal 23a) is larger than the thickness of the p-side interconnection layer 21. The thickness of the n-side metal pillar 24 (the thickness from the n-side interconnection layer 22 to the n-side external terminal 24a) is larger than the thickness of the n-side interconnection layer 22. The p-side metal pillar 23, the n-side metal pillar 24, and the resin layer 25 are thicker than the semiconductor layer 15.

The aspect ratio of the metal pillars 23 and 24 (the thickness ratio with respect to planar size) may be 1 or more, or less than 1. The metal pillars 23 and 24 may be thicker or thinner than the planar size.

The thickness of the supporting body 100 including the p-side interconnection layer 21, the n-side interconnection layer 22, the p-side metal pillar 23, the n-side metal pillar 24, and the resin layer 25 is thicker than the thickness of the light-emitting element (LED chip) including the semiconductor layer 15, the p-side electrode 16, and the n-side electrode 17.

The semiconductor layer 15 is formed on a substrate by using the epitaxial growth. The substrate is removed after forming the supporting body 100, and the substrate is not provided on the first face 11a side of the semiconductor layer 15. The semiconductor layer 15 is supported not by a rigid plate substrate, but by the supporting body 100 composed of the metal pillars 23 and 24 and the resin layer 25.

The p-side interconnection portion 41 and the n-side interconnection portion 43 may be made of materials, for example, such as copper, gold, nickel, and silver. Heat conductivity, migration resistance, and adhesion for the insulating material can be improved by using copper.

The resin layer 25 reinforces the p-side metal pillar 23 and the n-side metal pillar 24. The resin layer 25 is desirably made of materials having the same or similar coefficient of thermal expansion as the mounting substrate. Examples of such materials for the resin layer 25 include resins of primarily epoxy resin, resins of primarily silicone resin, and resins of primarily fluororesin. The base resin in the resin layer 25 contains additives such as a light absorbing agent, a light reflecting agent, and a light scattering agent, making the resin layer 25 lightproof or reflective for light from the light-emitting layer 13. This enables reduction of leakage of light from the side face and the mounting surface side of the supporting body 100.

Because of the heat cycle during the mounting of the semiconductor light-emitting device, the semiconductor layer 15 is subjected to stress due to such factors as soldering of the p-side external terminal 23a and the n-side external terminal 24a to the pads of the mounting substrate. The p-side metal pillar 23, the n-side metal pillar 24, and the resin layer 25 absorb and relieve such stress. The resin layer 25, softer than the semiconductor layer 15 and used as a part of the supporting body 100 particularly improves the stress relieving effect.

The substrate used for the formation (growth) of the semiconductor layer 15 is removed from the semiconductor layer 15. This reduces the height of the semiconductor light-emitting device. It also becomes possible to form microirregularities on the first face 11a after the removal of the substrate from this surface of the semiconductor layer 15, and improve the efficiency at which light can be extracted. For example, wet etching with an alkaline solution, or dry etching is used to form microirregularities, and the rough surface (first face 11a) is formed on the light extracting side of the semiconductor layer 15. The rough surface can reduce the total reflection component, and improve the light extraction efficiency.

The fluorescent material layer 30 is formed on the roughened first face 11a via an insulating film 51. The insulating film 51 serves as an adhesive layer to improve the adhesion between the semiconductor layer 15 and the fluorescent material layer 30. For example, the insulating film 51 is an inorganic film such as a silicon oxide film or a silicon nitride film.

The fluorescent material layer 30 has a structure in which the particulate fluorescent materials 31 are dispersed in the transparent layer 32. The transparent layer 32 is, for example, a transparent resin layer of primarily silicone resin.

The fluorescent material layer 30 spreads to the outer periphery of the chip from the first face 11a. The insulating film 18, serving as an adhesive layer, is provided between the resin layer 25 and the fluorescent material layer 30, and between the n-side electrode 17 and the fluorescent material layer 30 at the outer periphery of the chip.

The fluorescent material layer 30 does not cover or surround the second face side of the semiconductor layer 15, the metal pillars 23 and 24, or the side face of the supporting body 100. The side face of the fluorescent material layer 13 is aligned with the side face of the supporting body 100 (side face of the resin layer 25).

That is, the semiconductor light-emitting device of the embodiment is a very small device of a chip-size package structure. This improves the freedom of lamp fitting design in applications, for example, such as lamp fittings for lighting.

Cost also can be reduced because the fluorescent material layer 30 is not unnecessarily formed on the mounting face side where light is not extracted to outside. The device also allows the heat of the light-emitting layer 13 to be released to the mounting substrate side via the p-side interconnection layer 21, the n-side interconnection layer 22, and the metal pillars 23 and 24 of large thicknesses spreading over the second face side, and excels in heat radiation despite its compactness.

In common flip-chip mounting, the fluorescent material layer is formed over the whole LED chip after the chip is mounted on a mounting substrate via bumps or the like. Alternatively, resin is underfilled between bumps.

In contrast, in the embodiment, the resin layer 25, different from the fluorescent material layer 30, has already been provided around the p-side metal pillar 23 and the n-side metal pillar 24 at the time of mounting, and the mounting surface side can have properties suited for relieving stress. The provision of the resin layer 25 on the mounting face side prior to mounting also eliminates the need for the post-mounting underfill.

An optical layer of a design that is more oriented toward properties such as light extraction efficiency, color conversion efficiency, and light distribution is provided on the first face (roughed surface) 11a side, whereas a layer that is oriented toward relieving stress during mounting, or providing properties as a substrate-replacing supporting body is provided on the mounting surface side. For example, the resin layer 25 may be filled with a high density of fillers such as silica particles to appropriately adjust hardness for use as a supporting body.

The light emitted from the light-emitting layer 13 toward the first face 11a side enters into the fluorescent material layer 30, and some of the light excites the fluorescent materials 31. The light from the fluorescent materials 31 mixes with the light from the light-emitting layer 13, and produces, for example, pseudo white light.

If a substrate is provided on the first face 11a side, some of the light do not enter into the fluorescent material layer 30 and leak out from the side face of the substrate. Light with the color shifted to the light of the light-emitting layer 13 leaks out from the side face of the substrate. This may cause color breakup or unevenness. For example, a blue ring may appear at the outer edges when the fluorescent material layer 30 is viewed from above.

In the embodiment, the substrate is absent between the first face 11a and the fluorescent material layer 30. Color breakage or unevenness caused when light with the color shifted to the light of the light-emitting layer 13 leaks out from the side face of the substrate can be prevented.

In the embodiment, the contact area of the n-side electrode 17 and the side face 11b of the first semiconductor layer 11 is larger than the total area of the contact area of the n-side electrode 17 and the first n-side region 11d on the second face side of the first semiconductor layer 11, and the contact area of the n-side electrode 17 and the second n-side region 11c on the second face side of the first semiconductor layer 11.

Because the area of contact between the n-side electrode 17 and the first semiconductor layer 11 is restricted on the second face side of the first semiconductor layer 11, the stacked layer 14 including the light-emitting layer 13, and the p-side electrode 16 provided in contact with the stacked layer 14 can spread over a relatively larger area (light-emitting region) on the second face side. The larger light-emitting region improves the light flux of the semiconductor light-emitting device.

It may become difficult to efficiently pass current in the vicinity of the planar center of the light-emitting layer 13 when the n-side electrode 17 and the first semiconductor layer 11 are in contact with each other only at the side face 11b of the first semiconductor layer 11.

In the embodiment, the n-side electrode 17 is in contact with the first n-side region 11d of the first semiconductor layer 11 also in the vicinity of the center on the second face side, and current can be uniformly passed through the light-emitting layer 13.

The embodiment can thus provide a semiconductor light-emitting device that can produce a large flux of uniform light with a uniform current distribution that is achieved despite the large light-emitting region.

The second portion 17c of the n-side electrode 17 provided in the first n-side region 11d does not have a contact portion for the n-side interconnection layer 22. The second portion 17c can thus have a reduced width and a reduced area, and the area of the light-emitting region where the light-emitting layer 13 and the p-side electrode 16 are provided can be relatively increased.

The contact portion 17d between the n-side electrode 17 and the n-side interconnection layer 22 overlaps the p-side electrode 16 via the insulating film 18. The contact portion 17d is not in contact with the second face of the first semiconductor layer 11. The contact portion 17d thus does not restrict the area of the p-side electrode 16, and the light-emitting region can be increased.

The n-side electrode 17 is an integral unit of the first portion 17a, the second portion 17c, the third portion 17e, the fourth portion 17b, and the contact portion 17d. Accordingly, the contact between the n-side interconnection layer 22 and the n-side electrode 17 only needs to be made at one location. The n-side interconnection layer 22 does not need to contact each portion of the n-side electrode 17.

The fourth portion 17b connecting the first portion 17a to the third portion 17e and to the contact portion 17d overlaps the end portion of the p-side electrode 16 via the insulating film 18.

Therefore, the width of the fourth portion 17b can be increased to decrease the overall resistance of the n-side electrode 17, without sacrificing the area of the p-side electrode 16. This makes it possible to increase the efficiency of supplying current to the light-emitting layer 13, and enable the semiconductor light-emitting device to produce a large flux of uniform light.

Figure 3A:
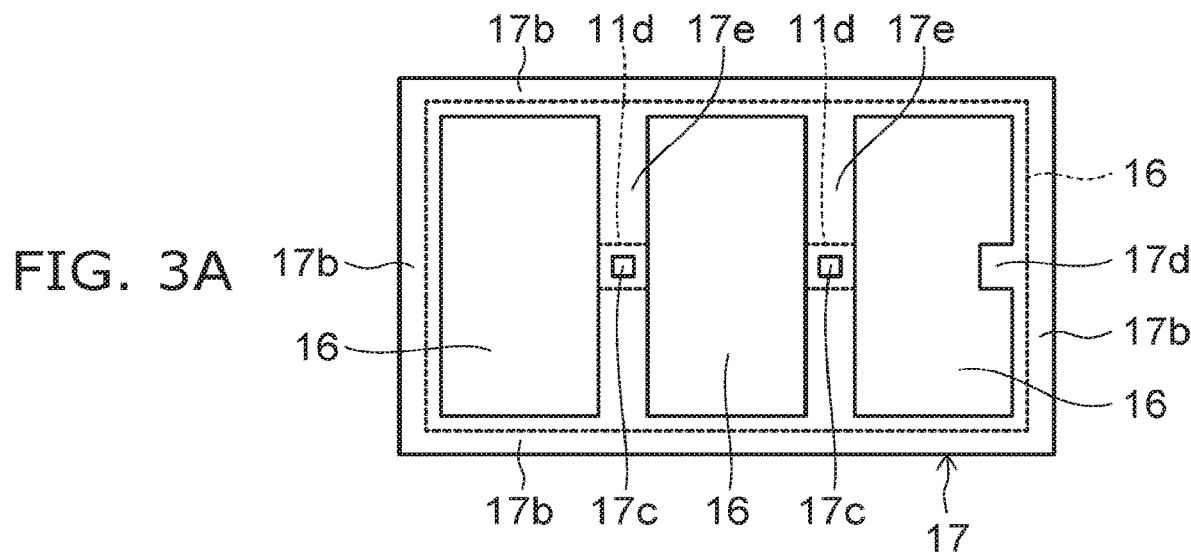
FIGS. 3A to 3C are schematic plan views of the semiconductor light-emitting device of the embodiment.
Figure 3B:
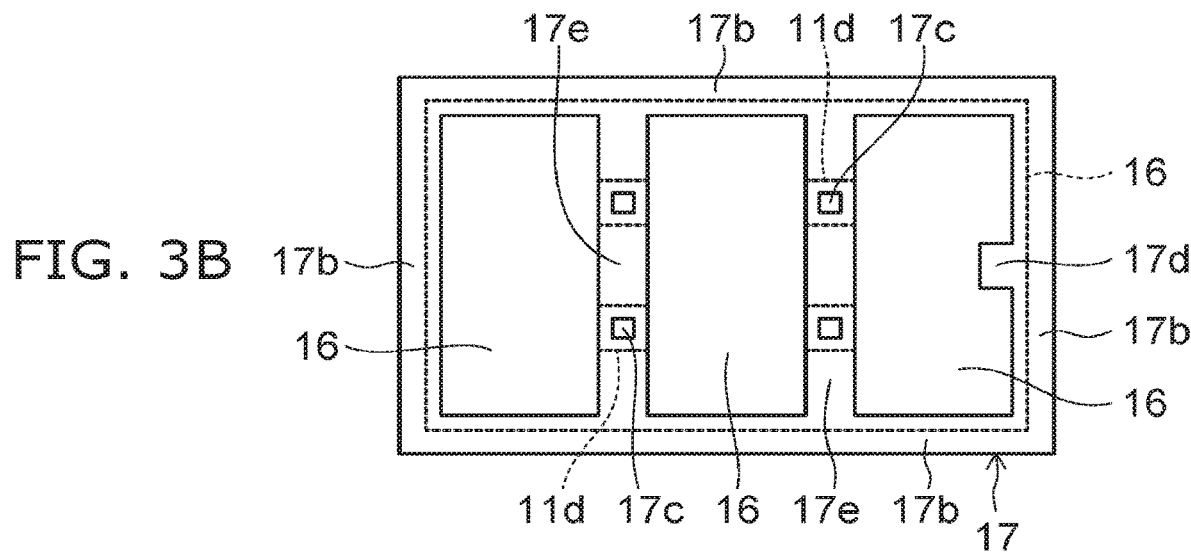
Figure 3C:
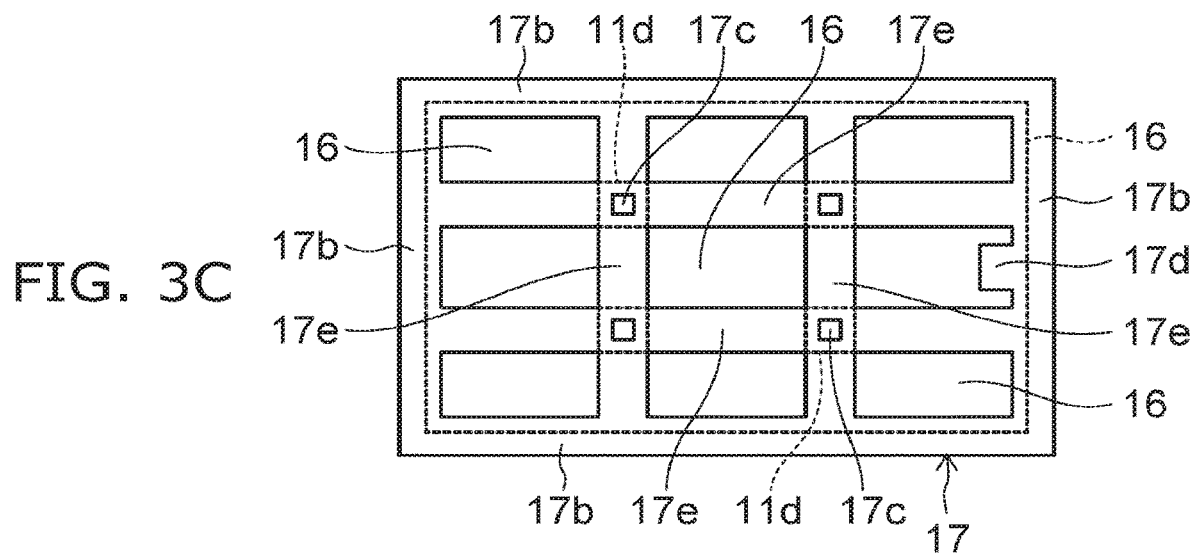

As shown in FIGS. 3A, 3B, and 3C, more than one first n-side region 11d may be provided, and the n-side electrode 17 may have more than one second portion 17c. A plurality of first n-side regions 11d is disposed in a dot-like pattern. The fourth portion 17b at the outer periphery of the semiconductor layer 15 is connected to the second portions 17c with a plurality of third portions 17e.

With the plurality of first n-side regions 11d and the plurality of second portions 17c in the n-side electrode 17, current can be more evenly distributed over the plane of the semiconductor layer 15.

As shown in FIG. 3C, the third portions 17e may have a form of a grid so as to intersect at the second portions 17c.

A method for manufacturing the semiconductor light-emitting device of the embodiment is described below with reference to FIG. 4A to FIG. 10.

Figure 4A:
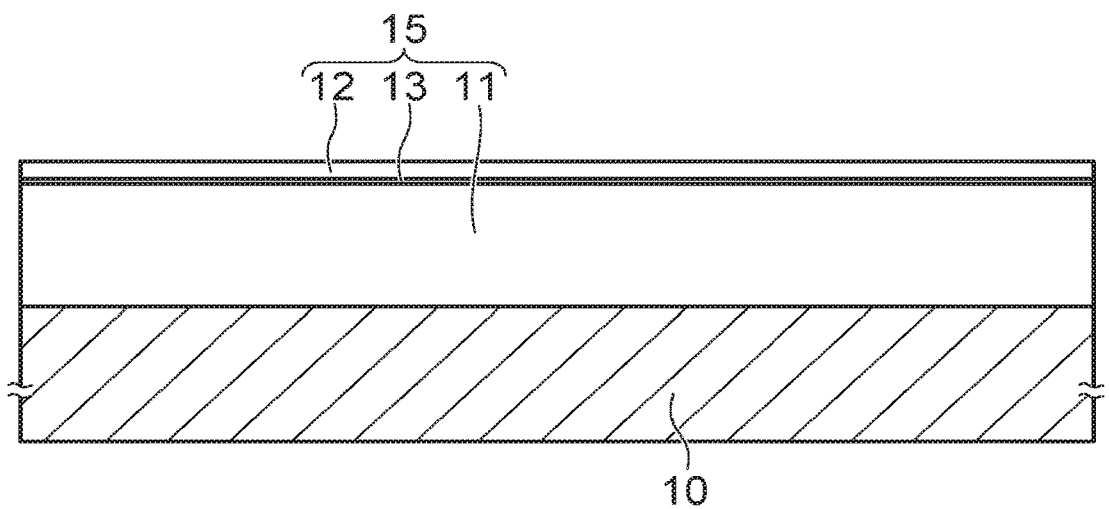
FIGS. 4A to 10 are schematic cross sectional views showing a method for manufacturing the semiconductor light-emitting device of the embodiment.

As shown in FIG. 4A, the first semiconductor layer 11, the light-emitting layer 13, and the second semiconductor layer 12 are epitaxially grown on the major surface of a substrate 10 in order, by using, for example, the MOCVD (metal organic chemical vapor deposition) technique.

The substrate 10 is, for example, a silicon substrate. The substrate 10 may be a sapphire substrate. The semiconductor layer 15 is, for example, a nitride semiconductor layer containing gallium nitride (GaN).

The first semiconductor layer 11 has, for example, a buffer layer provided on the major surface of the substrate 10, and an n-type GaN layer provided on the buffer layer. The second semiconductor layer 12 has, for example, a p-type GaN layer. The light-emitting layer 13 has, for example, an MQW (multiple quantum well) structure.

Figure 4B:
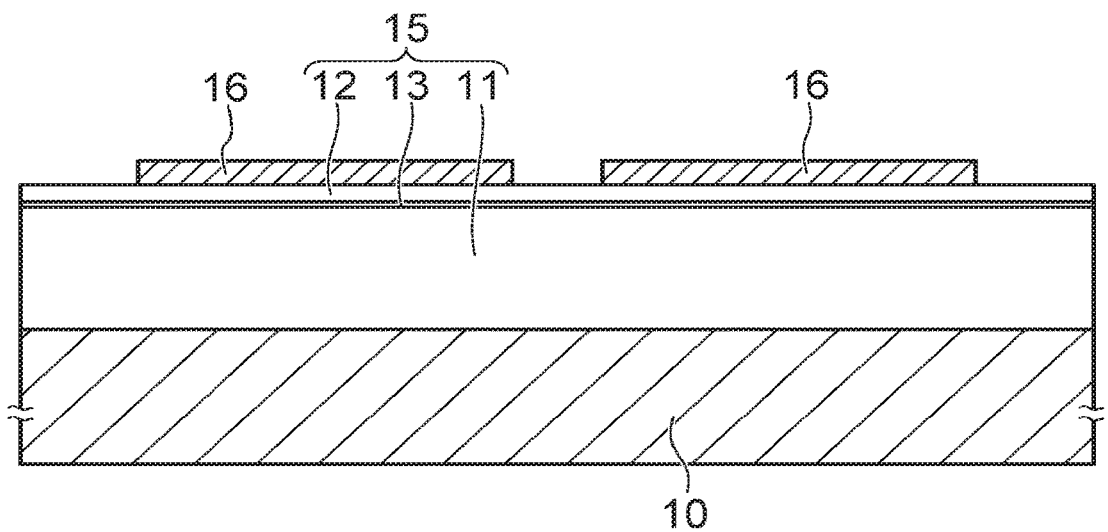

The p-side electrode 16 is selectively formed on the semiconductor layer 12, as shown in FIG. 4B.

Figure 4C:
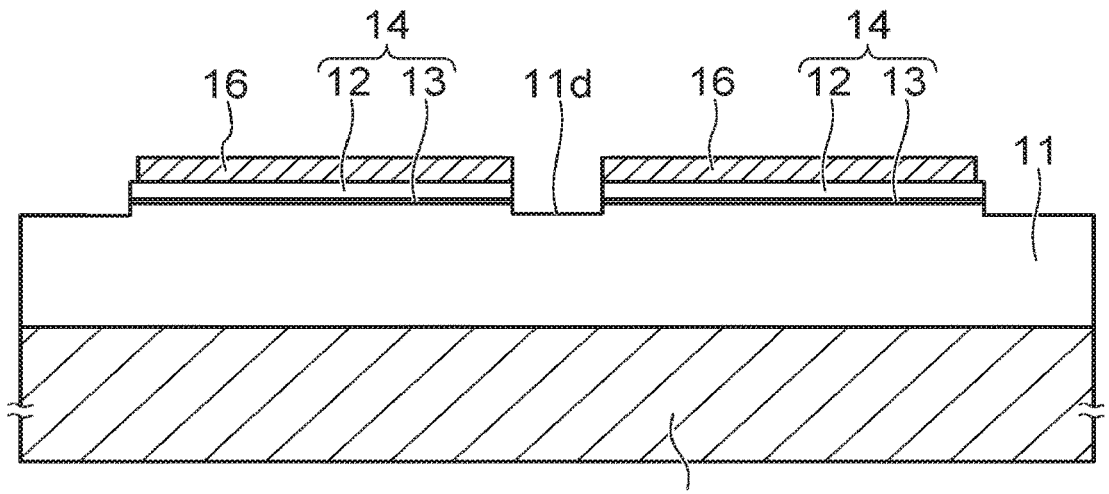

Thereafter, as shown in FIG. 4C, the second semiconductor layer 12 and the light-emitting layer 13 are removed by selective etching to selectively expose the first semiconductor layer 11, using, for example, RIE (reactive ion etching) with a mask (not shown).

This exposes the first n-side region 11d in a region surrounded by the stacked layer (mesa) 14 including the second semiconductor layer 12 and the light-emitting layer 13, and by the p-side electrode 16.

Figure 5A:
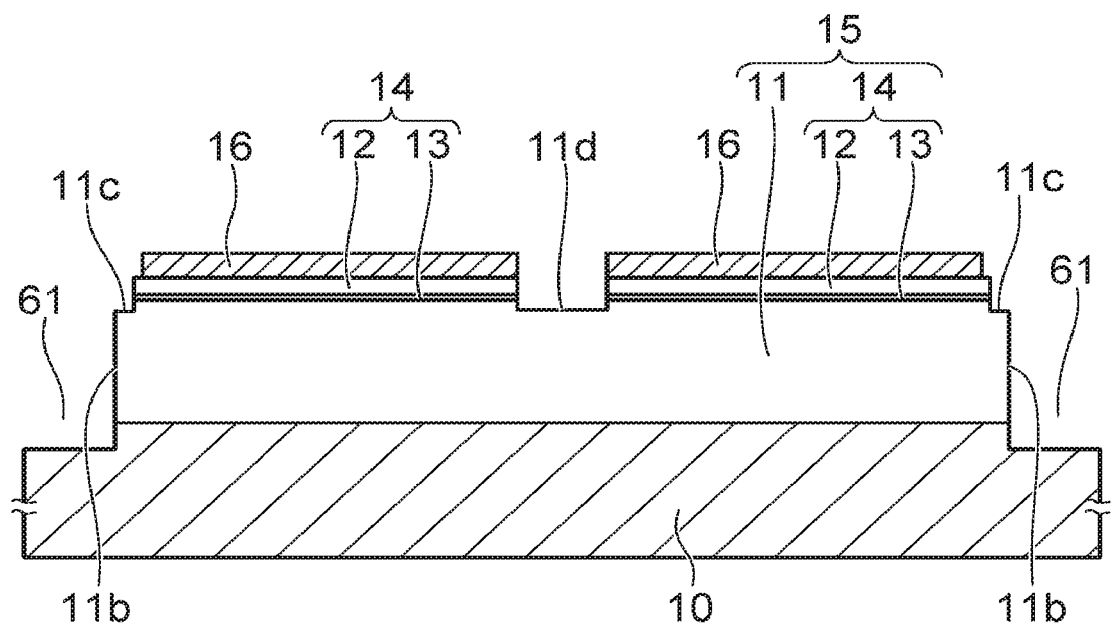

Thereafter, as shown in FIG. 5A, the first semiconductor layer 11 is selectively removed to form grooves 61. The grooves 61 isolate the semiconductor layers 15 from one another on the major surface of the substrate 10. The grooves 61 are formed, for example, in a grid pattern on the wafer of the substrate 10.

The grooves 61 reach the substrate 10 through the semiconductor layer 15. The major surface of the substrate 10 is slightly etched so that the bottom of the grooves 61 is below the interface between the substrate 10 and the first semiconductor layer 11.

Figure 5B:
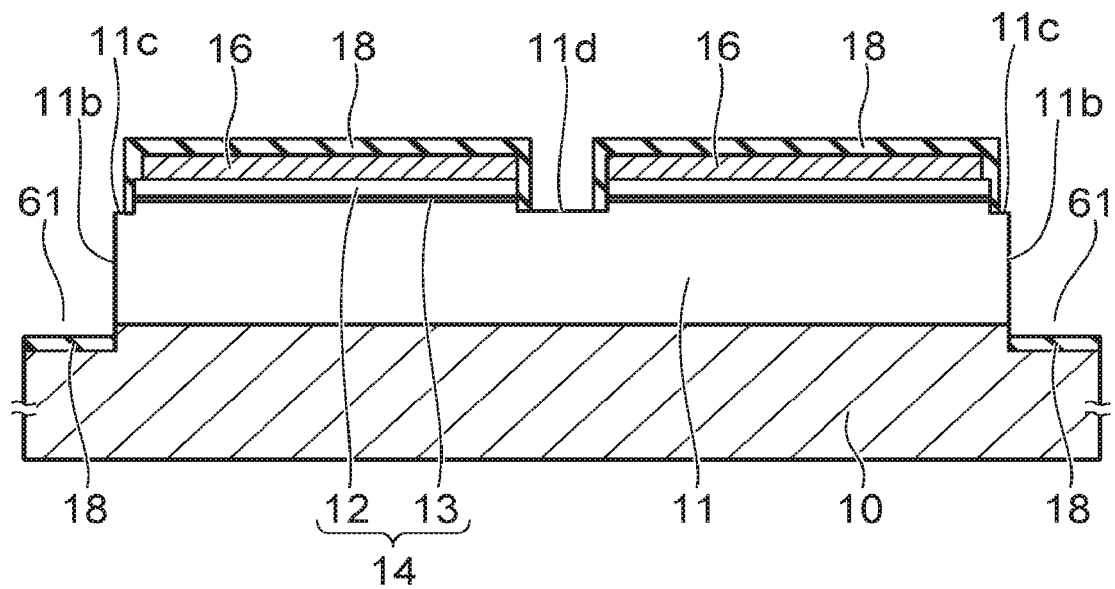

Thereafter, as shown in FIG. 5B, the insulating film 18 is formed so as to cover the structure on the substrate 10. The insulating film 18 has openings that are selectively formed, for example, by etching using a resist mask. The openings expose the side face 11b of the first semiconductor layer 11, and the first n-side region 11d. The openings also partially expose the second n-side region 11c of the first semiconductor layer 11 provided between the side face 11b of the first semiconductor layer 11 and the stacked film 14.

The insulating film 18 covers the upper surface of the p-side electrode 16, the side face of the p-side electrode 16, and the side face of the stacked film 14. The insulating film 18 also covers the bottom surface of the grooves 61.

The side face 11b of the first semiconductor layer 11 are not aligned with the side face of the stacked film 14. The step difference between the side face 11b of the first semiconductor layer 11 and the side face of the stacked film 14 makes it easier to expose the side face 11b of the first semiconductor layer 11 with the insulating film 18 covering the side face of the stacked film 14.

Figure 6A:
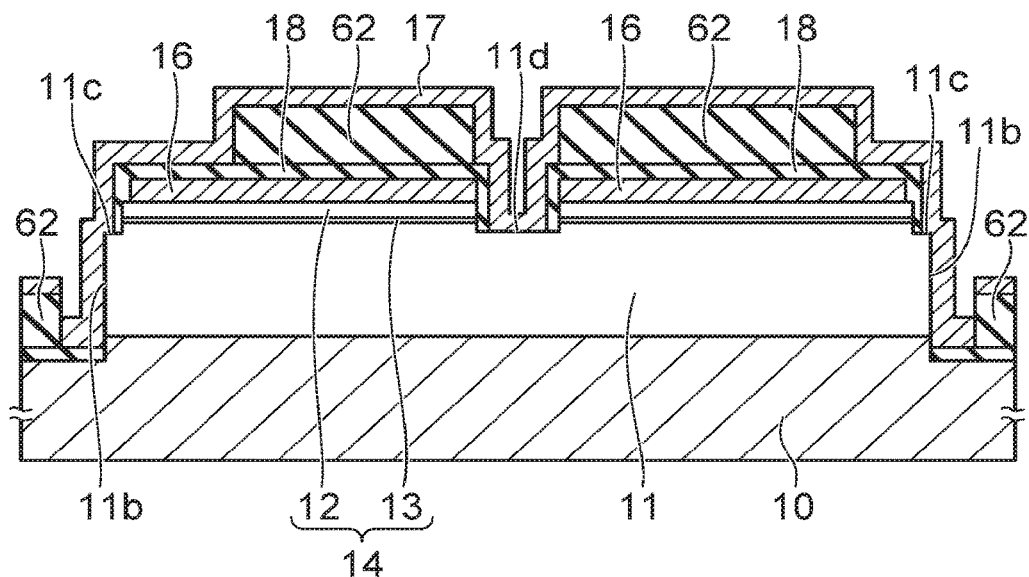

As shown in FIG. 6A, a resist film 62 is selectively formed on the insulating film 18, and the n-side electrode 17 is formed on the resist film 62, and on the insulating film 18 in portions not covered by the resist film 62.

The n-side electrode 17 is formed in contact with the side face 11b of the first semiconductor layer 11. The n-side electrode 17 is formed in the first n-side region 11d and in the second n-side region 11c.

The resist film 62 is removed after forming the n-side electrode 17. The n-side electrode 17 covering the resist film 62 is removed with the resist film 62. The n-side electrode 17 is lifted off with the resist film 62.

Figure 6B:
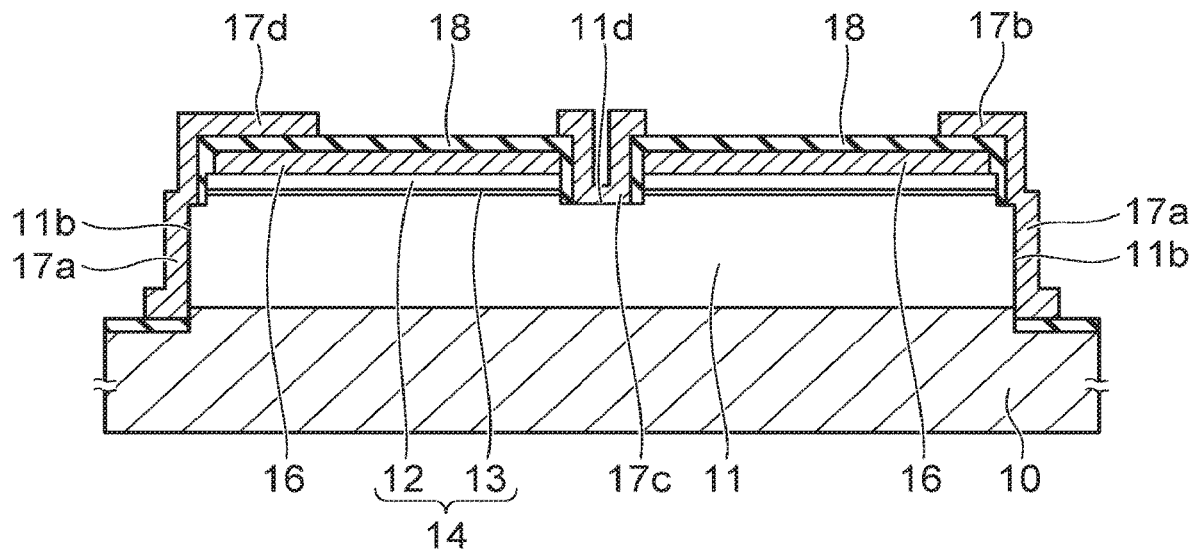

As shown in FIG. 6B, the first portion 17a, the second portion 17c, the third portion 17e (see FIG. 2B), the fourth portion 17b, and the contact portion 17d of the n-side electrode 17 remain.

The insulating film 19 is formed on the n-side electrode 17 and on the insulating film 18, as shown in FIG. 7A. The opening 82 that exposes the contact portion 17d of the n-side electrode 17 is formed in the insulating film 19. The plurality of openings 81 that exposes the p-side electrode 16 is formed in the insulating films 18 and 19 on the p-side electrode 16.

Figure 7B:
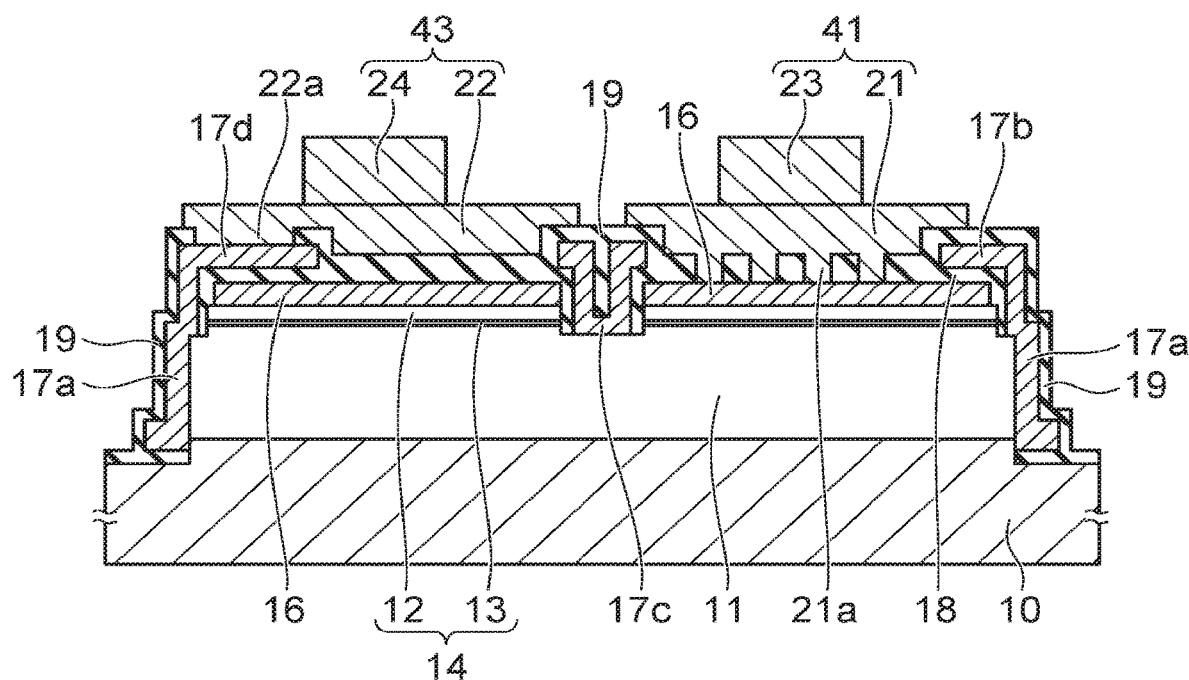
Figure 8:
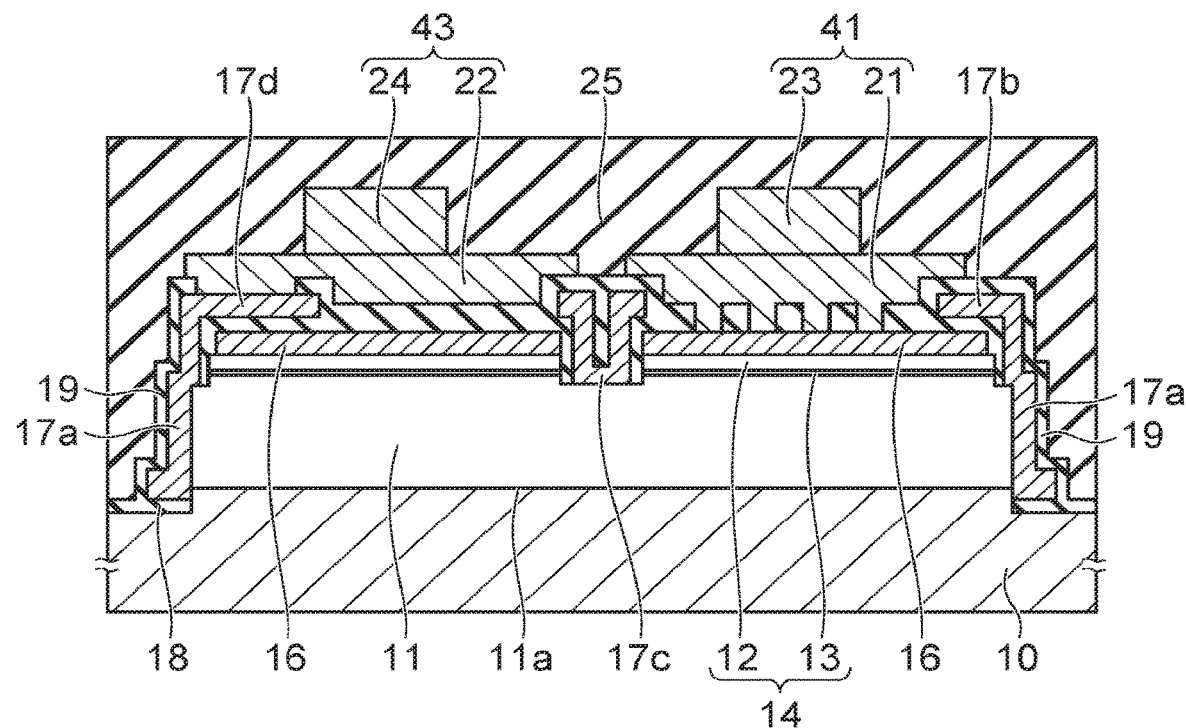

Thereafter, as shown in FIG. 7B, the p-side interconnection layer 21 and the n-side interconnection layer 22 are formed on the insulating film 19 by using electrolytic copper plating with a resist mask (not shown).

The p-side interconnection layer 21 is also formed in the openings 81, and is electrically connected to the p-side electrode 16. The n-side interconnection layer 22 is also formed in the opening 82, and is electrically connected to the contact portion 17d of the n-side electrode 17.

Thereafter, the p-side metal pillar 23 and the n-side metal pillar 24 are formed by electrolytic copper plating with a resist mask (not shown), using the p-side interconnection layer 21 and the n-side interconnection layer 22 as seed layers.

The p-side metal pillar 23 is formed on the p-side interconnection layer 21. The p-side interconnection layer 21 and the p-side metal pillar 23 are formed as an integral unit using the same copper material. The n-side metal pillar 24 is formed on the n-side interconnection layer 22. The n-side interconnection layer 22 and the n-side metal pillar 24 are formed as an integral unit using the same copper material.

Thereafter, the resin layer (FIG. 8) is formed on the structure shown in FIG. 7B. The resin layer 25 covers the p-side interconnection portion 41 including the p-side interconnection layer 21 and the p-side metal pillar 23, and the n-side interconnection portion 43 including the n-side interconnection layer 22 and the n-side metal pillar 24.

The resin layer 25 is also formed at the periphery portion of the chip, and covers the first portion 17a of the n-side electrode 17 via the insulating film 19.

The supporting body 100 is configured from the resin layer 25, together with the p-side interconnection portion 41 and the n-side interconnection portion 43. The substrate 10 is removed from the semiconductor layer 15 being supported by the supporting body 100.

The substrate 10 (silicon substrate) is removed by, for example, wet etching or dry etching. When the substrate 10 is a sapphire substrate, the substrate may be removed by using a laser lift-off technique.

The semiconductor layer 15 epitaxially grown on the substrate 10 may have large internal stress. The p-side metal pillar 23, the n-side metal pillar 24, and the resin layer 25 are softer than the semiconductor layer 15 of GaN material, and can thus absorb stress even when the internal stress caused by the epitaxial growth is released at once during delamination. The semiconductor layer 15 is thus not damaged in the process of removing the substrate 10.

Figure 9:
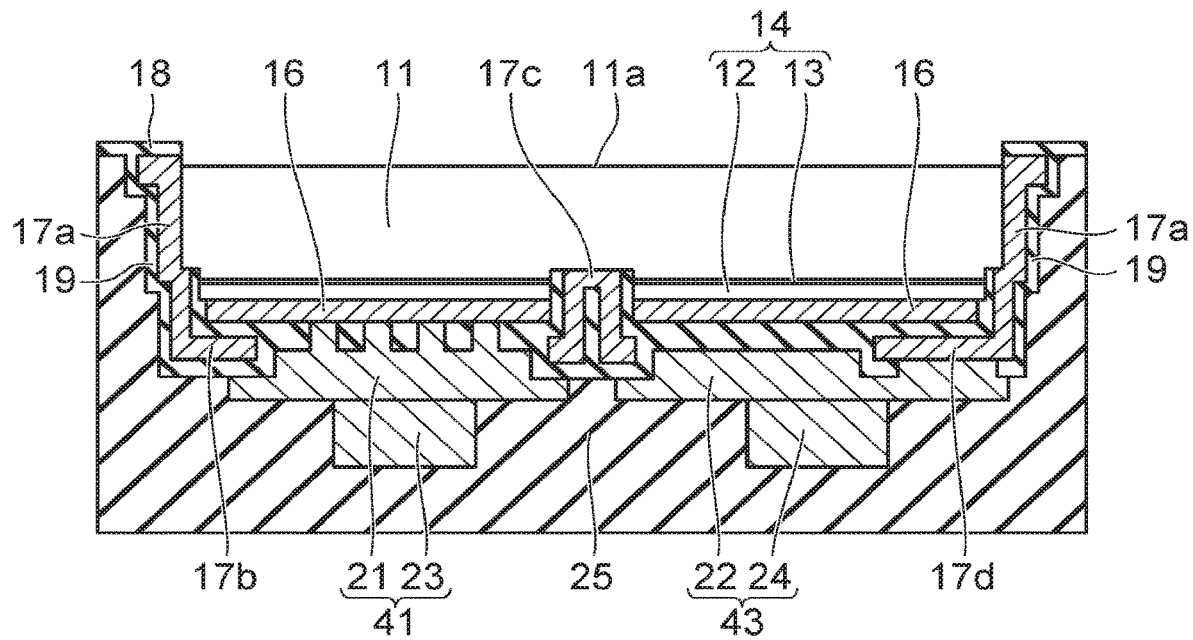
Figure 10:
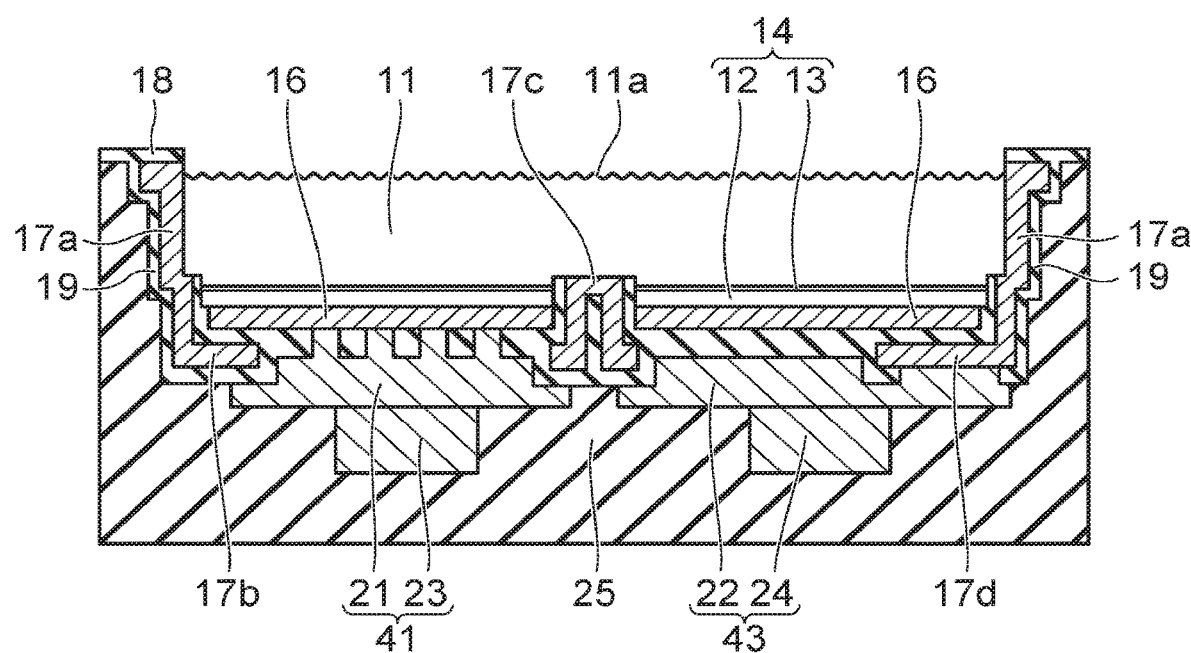

The removal of the substrate 10 exposes the first face 11a of the first semiconductor layer 11, as shown in FIG. 9. Microasperities are formed on the exposed first face 11a, as shown in FIG. 10. For example, the first face 11a is wet etched with an etchant such as a KOH (potassium hydroxide) aqueous solution, and TMAH (tetramethylammonium hydroxide). The etching involves a crystal-face dependent difference in etching rate, and this difference in etching rate enables formation of asperities on the first face 11a. The microasperities formed on the first face 11a can improve the extraction efficiency of radiant rays from the light-emitting layer 13. Microasperities also may be formed on the first face 11a by dry etching with a resist mask.

The fluorescent material layer 30 is formed on the first face 11a via the insulating film 51, as shown in FIG. 1. The insulating film 51 is also formed on the insulating film 18 at the outer periphery of the chip. The fluorescent material layer 30 is formed by using methods such as printing, potting, molding, and compression molding. The insulating film 51 improves the adhesion between the first semiconductor layer 11 and the fluorescent material layer 30. The insulating film 51 is, for example, an inorganic insulating film such as a silicon oxide film, a silicon nitride film, and a silicon oxynitride film.

A fired fluorescent material obtained by firing fluorescent materials with a binder may be bonded to the insulating film 51 to form the fluorescent material layer 30.

After forming the fluorescent material layer 30, the surface of the resin layer 25, which is the lower surface in FIG. 10, is ground to expose the p-side metal pillar 23 and the n-side metal pillar 24 from the resin layer 25. The exposed surface of the p-side metal pillar 23 becomes the p-side external terminal 23a, and the exposed surface of the n-side metal pillar 24 becomes the n-side external terminal 24a.

Thereafter, the wafer is cut at the regions where the grooves 61 isolating the semiconductor layers 15 are formed. This cuts the fluorescent material layer 30, the insulating films 18 and 19, and the resin layer 25. For example, a dicing blade, or a laser beam is used. The semiconductor layer 15 does not exist in the dicing regions, and is not damaged by dicing.

The foregoing steps that precede the cutting of the wafer into individual devices are performed on the wafer containing the semiconductor layers 15. The wafer is cut into individual semiconductor light-emitting devices to include at least one semiconductor layer 15. The semiconductor light-emitting devices may be of a single chip structure with a single semiconductor layer 15, or of a multi chip structure with a plurality of semiconductor layers 15.

The foregoing steps that precede the cutting of the wafer into individual devices are all performed in a wafer state, and there is no need to form interconnections or pillars for each individual device, nor does it required to package each device with the resin layer, or form the fluorescent material layer for each device. This greatly reduces cost.

Because the supporting body 100 and the fluorescent material layer 30 are cut in the form of a wafer after being formed, the side face of the fluorescent material layer 30 are in line with the side face of the supporting body 100 (side face of the resin layer 25), and these side face form the side face of each individual semiconductor light-emitting device. This, combined with the absence of substrate 10, enables providing of a small semiconductor light-emitting device of a chip-size package.

Figure 11:
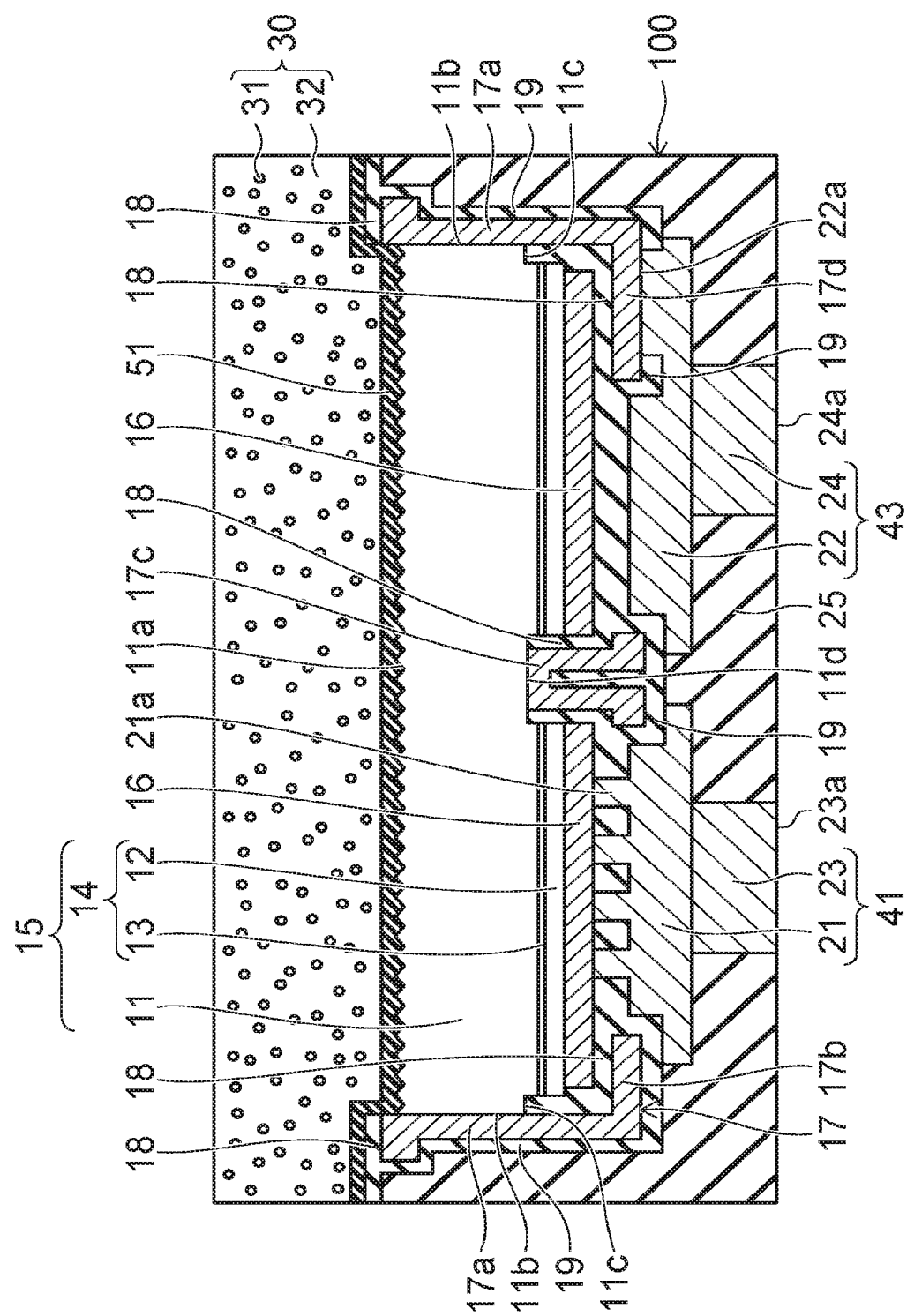
FIG. 11 is a schematic cross sectional view of a semiconductor light-emitting device of the embodiment.

As shown in FIG. 11, the first portion 17a of the n-side electrode 17 may contact only the side face 11b, without contacting the second n-side region 11c of the first semiconductor layer 11.

Figure 12:
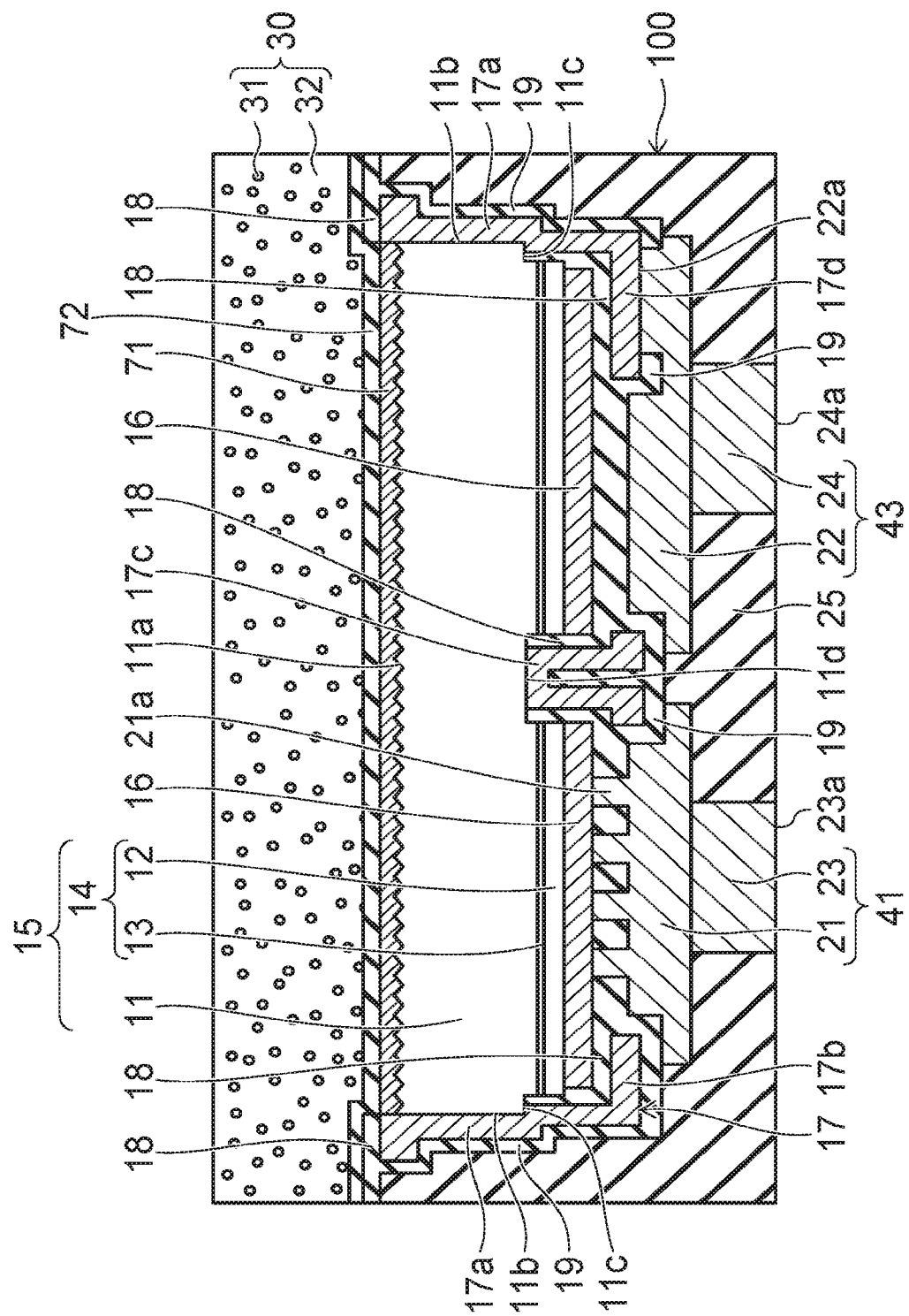
FIG. 12 is a schematic cross sectional view of a semiconductor light-emitting device of the embodiment.

FIG. 12 is a schematic cross sectional view of another specific example of the semiconductor light-emitting device of the embodiment.

In the semiconductor light-emitting device shown in FIG. 12, a transparent electrode 71, for example, such as ITO (indium tin oxide) is provided on the first face 11a that is continuous to the side face 11b of the first semiconductor layer 11. The transparent electrode 71 is connected to the first portion 17a of the n-side electrode 17. The transparent electrode 71 is in contact with the inner walls at the end portions of the first portion 17a on the first face 11a side.

An insulating film 72 is provided between the transparent electrode 71 and the fluorescent material layer 30 to improve adhesion between these two components. The insulating film 72 is, for example, an inorganic insulating film such as a silicon oxide film, and a silicon nitride film.

By the provision of the transparent electrode 71 connected to the n-side electrode 17 and provided over the whole surface of the first face 11a of the first semiconductor layer 11, the uniformity of the current through the first semiconductor layer 11 can be further improved in plane direction.

The major surface of the substrate 10 becomes slight recessed when forming the grooves 61 that isolate the first semiconductor layers 11, as described above with reference to FIG. 5A. Accordingly, as shown in FIG. 6B, the end portions of the first portion 17a of the n-side electrode 17 project out toward the substrate 10 away from the first face 11a of the first semiconductor layer 11 upon forming the first portion 17a on the side face of the grooves 61.

The substrate 10 is removed, and the first face 11a is roughened as shown in FIG. 10. This exposes the inner walls of the first portion 17a of the n-side electrode 17 at the end portions. A transparent electrode 71 can then be formed on the first face 11a in this state to contact the transparent electrode 71 to the end portions of the first portion 17a.

Figure 13:
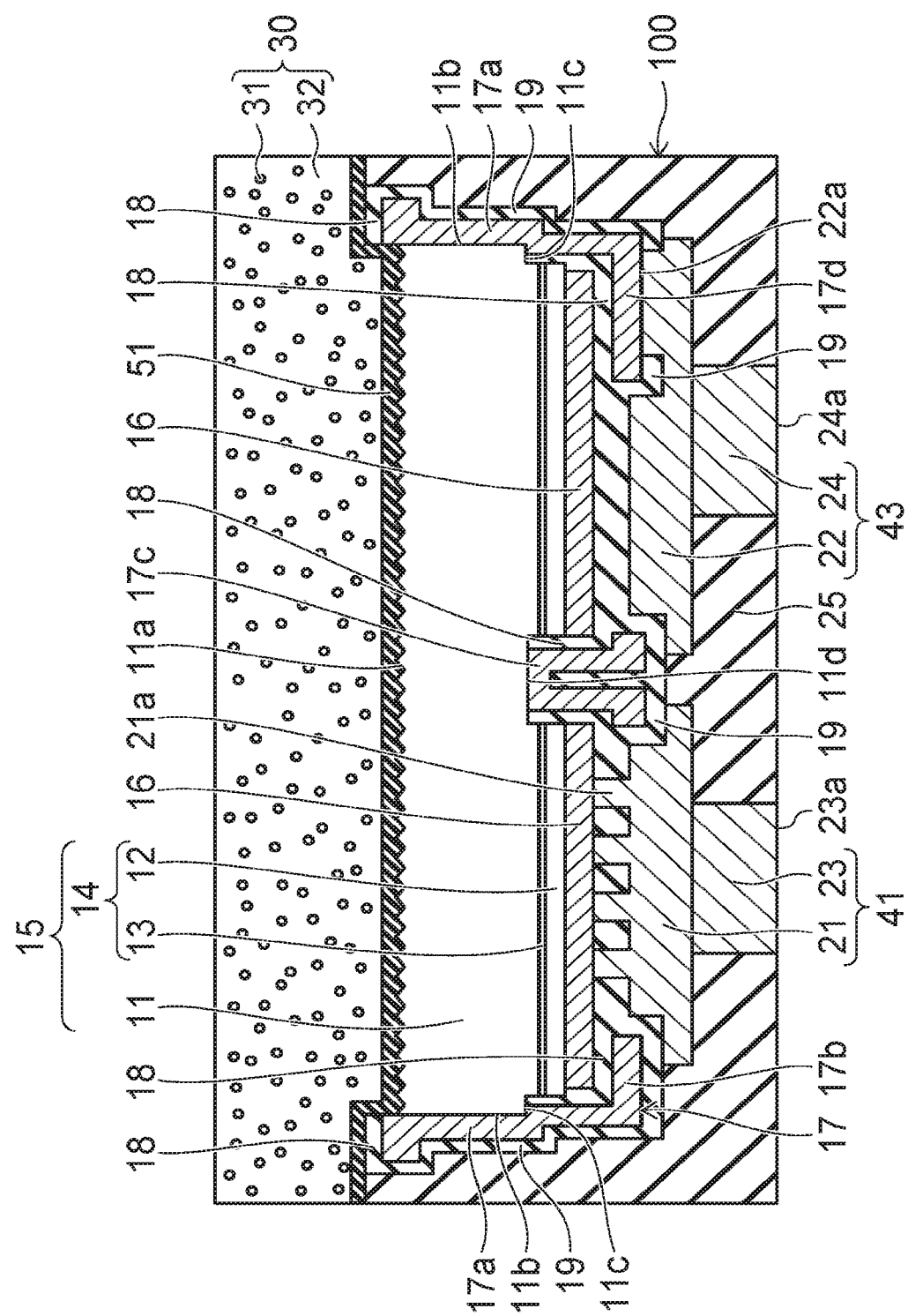
FIG. 13 is a schematic cross sectional view of a semiconductor light-emitting device of the embodiment.

FIG. 13 is a schematic cross sectional view of yet another example of the semiconductor light-emitting device of the embodiment.

In the embodiment shown in FIG. 13, the insulating film (inorganic insulating film) 18 at the outer periphery of the chip does not extend to the side face of the semiconductor light-emitting device. The insulating film 18 provided at the outer periphery of the chip is covered with the resin layer 25, and the resin layer 25 forms the side face of the semiconductor light-emitting device.

Accordingly, the insulating film 18 does not exist in the dicing regions of the diced wafer. This prevents cracking as might occur at the interface between the insulating film 18 and the fluorescent material layer 30 or between the insulating film 18 and the resin layer 25 under the impact of dicing. Entry of moisture through such cracks can thus be prevented to improve the reliability of the semiconductor light-emitting device.

Figure 14:
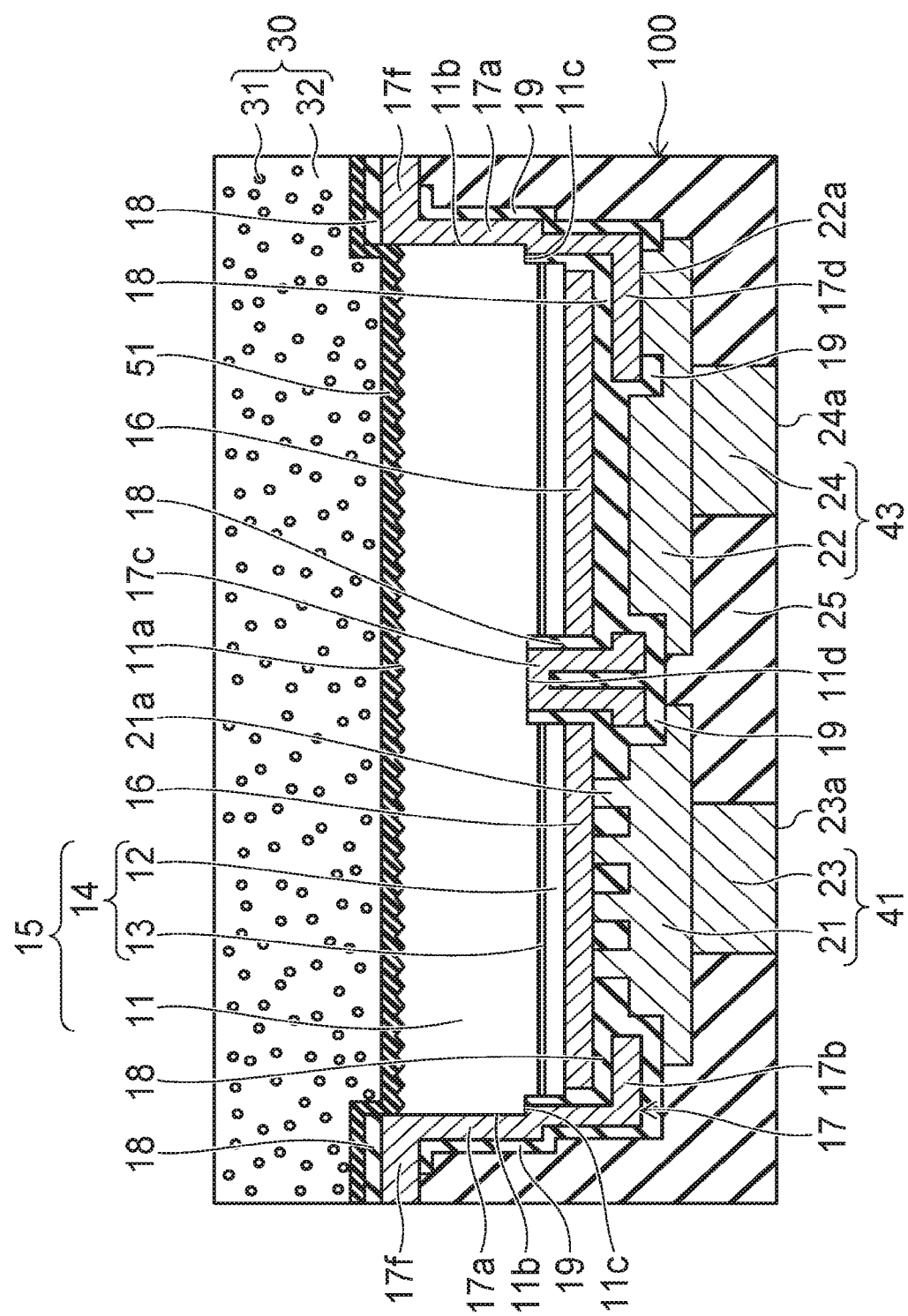
FIG. 14 is a schematic cross sectional view of a semiconductor light-emitting device of the embodiment.

FIG. 14 is a schematic cross sectional view of still another example of the semiconductor light-emitting device of the embodiment.

In the embodiment shown in FIG. 14, the n-side electrode 17 has a fifth portion 17f provided between the resin layer 25 and the fluorescent material layer 30 at the outer periphery of the chip. The fifth portion 17f is integrally provided at the end portions of the first portion 17a provided on the side face 11b of the first semiconductor layer 11, and extends toward the side face of the semiconductor light-emitting device from the end portions of the first portion 17a.

The light emitted from the fluorescent materials 31 at the chip outer periphery of the semiconductor light-emitting device down toward the supporting body 100 can thus be reflected at the fifth portion 17f of the n-side electrode 17 back toward the fluorescent material layer 30.

This makes it possible to prevent the loss of light from the fluorescent materials 31 due to absorption by the resin layer 25 at the chip outer periphery of the semiconductor light-emitting device, and improve the efficiency of extracting light from the fluorescent material layer 30 side.

The insulating film 18 provided between the fifth portion 17f and the fluorescent material layer 30 improves the adhesion between these two components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light-emitting device, comprising:
a semiconductor layer including a first semiconductor layer, a second semiconductor layer, and a light-emitting layer provided between the first semiconductor layer and the second semiconductor layer, the first semiconductor layer having a first n-side region surrounded by a stacked film including the light-emitting layer and the second semiconductor layer;
a fluorescent material layer provided on the first semiconductor layer;
a p-side electrode provided on the second semiconductor layer;
an insulating film provided on the p-side electrode;
an n-side electrode including a first portion, a second portion, and a third portion, the first portion provided on a side face of the first semiconductor layer, the second portion provided in the first n-side region, the third portion overlapping the p-side electrode via the insulating film and connecting the first portion and the second portion to each other;
a p-side interconnection portion provided on the insulating film and connected to the p-side electrode;
an n-side interconnection portion provided on the insulating film and connected to the n-side electrode; and
a resin layer provided around the semiconductor layer, an upper face of the resin layer being higher than an upper face of the first semiconductor layer with the fluorescent material layer being above the semiconductor layer.

2. The device according to claim 1, wherein the n-side electrode has a fourth portion provided along an outer periphery of the p-side electrode.

3. The device according to claim 2, wherein the fourth portion overlaps an end portion of the p-side electrode via the insulating film.

4. The device according to claim 2, wherein the fourth portion is connected to the third portion.

5. The device according to claim 2, wherein the n-side electrode includes a contact portion integrally provided with the fourth portion, and
the n-side interconnection portion is connected to the contact portion.

6. The device according to claim 5, wherein the contact portion overlaps the p-side electrode via the insulating film.

7. The device according to claim 1, wherein the n-side electrode includes an aluminum film in contact with the first semiconductor layer.

8. The device according to claim 1, wherein the p-side electrode includes a silver film in contact with the second semiconductor layer.

9. The device according to claim 1, wherein the n-side electrode contacts the first semiconductor layer at the first portion and at the second portion.

10. The device according to claim 1, wherein the first portion, the second portion, and the third portion of the n-side electrode are integrally formed with a same material.

11. The device according to claim 2, wherein the first portion, the second portion, the third portion, and the fourth portion of the n-side electrode are integrally formed with a same material.

12. The device according to claim 1, wherein
the first semiconductor layer has a second n-side region provided between the side face and the stacked film; and
the first portion of the n-side electrode is also provided in the second n-side region.

13. The device according to claim 12, wherein a contact area of the n-side electrode and the side face of the first semiconductor layer is larger than a total area of a contact area of the n-side electrode and the first n-side region, and a contact area of the n-side electrode and the second n-side region.

14. The device according to claim 1, wherein a plurality of first n-side regions is disposed in a dot-like pattern.

15. The device according to claim 1, further comprising a transparent electrode provided on a first face continuous to the side face of the first semiconductor layer, and connected to the first portion of the n-side electrode.

16. The device according to claim 15, wherein
the first portion of the n-side electrode has an end portion projecting out from the side face of the first semiconductor layer; and
the transparent electrode is in contact with the end portion of the first portion.

17. The device according to claim 1, wherein the fluorescent material layer is provided on the first semiconductor layer without a substrate interposed between the fluorescent material layer and the first semiconductor layer.

18. The device according to claim 1, further comprising an inorganic film provided between the first semiconductor layer and the fluorescent material layer.

19. The device according to claim 1, wherein
the p-side interconnection portion includes a p-side interconnection layer connected to the p-side electrode, and a p-side metal pillar provided on the p-side interconnection layer and thicker than the p-side interconnection layer; and
the n-side interconnection portion includes an n-side interconnection layer connected to the n-side electrode, and an n-side metal pillar provided on the n-side interconnection layer and thicker than the n-side interconnection layer.

20. The device according to claim 1, wherein the resin layer is also provided between the p-side interconnection portion and the n-side interconnection portion.

* * * * *